United States Patent
Shirota et al.

(10) Patent No.: US 7,095,651 B2
(45) Date of Patent: Aug. 22, 2006

(54) NON-VOLATILE SEMICONDUCTOR MEMORY DEVICE

(75) Inventors: Riichiro Shirota, Fujisawa (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/211,633

(22) Filed: Aug. 26, 2005

(65) Prior Publication Data

US 2005/0281087 A1   Dec. 22, 2005

Related U.S. Application Data

(62) Division of application No. 10/434,080, filed on May 9, 2003.

(30) Foreign Application Priority Data

May 10, 2002  (JP)  ............................... 2002-135424
Apr. 3, 2003   (JP)  ............................... 2003-100506

(51) Int. Cl.
*G11C 16/04* (2006.01)
*G11C 5/06* (2006.01)

(52) U.S. Cl. ............... 365/185.05; 365/72; 365/185.26; 365/185.28; 365/185.29

(58) Field of Classification Search .......... 365/185.05, 365/185.26

See application file for complete search history.

(56) References Cited

U.S. PATENT DOCUMENTS

| | | | |
|---|---|---|---|
| 5,204,835 A | 4/1993 | Eltan | |
| 5,798,965 A | 8/1998 | Jun | |
| 5,877,524 A * | 3/1999 | Oonakado et al. | 257/321 |
| 6,014,328 A | 1/2000 | Onakado et al. | |
| 6,275,413 B1 | 8/2001 | Naura | |
| 6,433,382 B1 * | 8/2002 | Orlowski et al. | 257/315 |
| 6,456,534 B1 * | 9/2002 | Jinbo | 365/185.25 |
| 6,568,510 B1 | 5/2003 | Cavaleri et al. | |
| 6,731,540 B1 * | 5/2004 | Lee et al. | 365/185.17 |
| 6,757,196 B1 * | 6/2004 | Tsao et al. | 365/185.17 |
| 6,822,286 B1 | 11/2004 | Hsu et al. | |
| 6,856,544 B1 * | 2/2005 | Nakamura | 365/185.11 |
| 2001/0005015 A1 * | 6/2001 | Futatsuyama et al. | 257/1 |
| 2003/0039146 A1 * | 2/2003 | Choi | 365/185.33 |
| 2004/0213046 A1 * | 10/2004 | Yoshida | 365/185.14 |

OTHER PUBLICATIONS

S. Shukuri, et al., IEEE 2001 Custom Integrated Circuits Conference, pp. 179-182, "CMOS Process Compatible ie-Flash(Inverse Gate Electrode Flash) Technology for System-on-a-Chip", 2001.
A. Bergemont, et al., Non-Volitile Semiconductor Memory Workshop 2000, pp. 86-89, "A Non-Violatile Memory Device With True CMOS Capatability", 2000.

\* cited by examiner

*Primary Examiner*—Amir Zarabian
*Assistant Examiner*—Ly Duy Pham
(74) *Attorney, Agent, or Firm*—Oblon, Spivak, McClelland, Maier & Neustadt, P.C.

(57) ABSTRACT

A memory cell has a selection transistor constituted of an MOS transistor having a gate electrode and a cell transistor constituted of an MOS transistor having the same polarity as the selection transistor, in such a configuration that these two transistors are connected in series. A bit line is connected to a drain region of the selection transistor and a word line is connected to the gate electrode thereof. A gate electrode of the cell transistor is not electrically connected anywhere so as to be in a floating potential state, while a drain region thereof is connected to a source region of the selection transistor. A source line is connected to a source region of the cell transistor.

6 Claims, 8 Drawing Sheets

NON-VOLATILE SEMICONDUCTOR MEMORY DEVICE

CROSS-REFERENCE TO RELATED APPLICATIONS

The present application is a Divisional of U.S. application Ser. No. 10/434,080, filed on May 9, 2003, and in turn claims priority to Japanese Patent Applications No. 2002-135424, filed May 10, 2002; and No. 2003-100506, filed Apr. 3, 2003, the entire contents of each of which are incorporated herein by reference.

BACKGROUND OF THE INVENTION

1. Field of the Invention

The present invention relates to a non-volatile semiconductor memory device which has non-volatile memory cells and which is especially suitable for being integrated in a semiconductor chip together with a peripheral logic circuit.

2. Description of the Related Art

Recently, on a user side constituting a semiconductor system, there increase demands for a non-volatile semiconductor memory device which is inexpensive and, capable of programming data after a semiconductor chip is manufactured. Such a non-volatile semiconductor memory device is required to be integrated in a semiconductor chip together with a central processing unit (CPU) or a micro processor unit (MPU) in order to assure a higher level of security.

As a non-volatile semiconductor memory device capable of electrical erasure, there is known such a device that a transistor having a stacked gate structure included of a control gate electrode and a floating gate electrode is used as a memory cell.

The non-volatile semiconductor memory device using the transistor having such a stacked gate structure is known to have a high reliability. Such a non-volatile semiconductor memory device, however, has inherent specifications, an element structure, and manufacturing processes and so has poor compatibility with the other logic products. Therefore, this type of non-volatile semiconductor memory device gives rise to a great increase in number of steps and costs if it is to be integrated in the same semiconductor chip together with a peripheral logic circuit such as a CPU or an MPU.

As a non-volatile semiconductor memory device that can be easily integrated in the same semiconductor chip together with the peripheral logic circuit, there is conventionally known one such as described in, for example, "A Non-Volatile Memory Device with True CMOS Compatibility" by A. Bergemount et al., Non-Volatile Semiconductor Memory Workshop, pp. 86–89, 2000.

Figure 1:
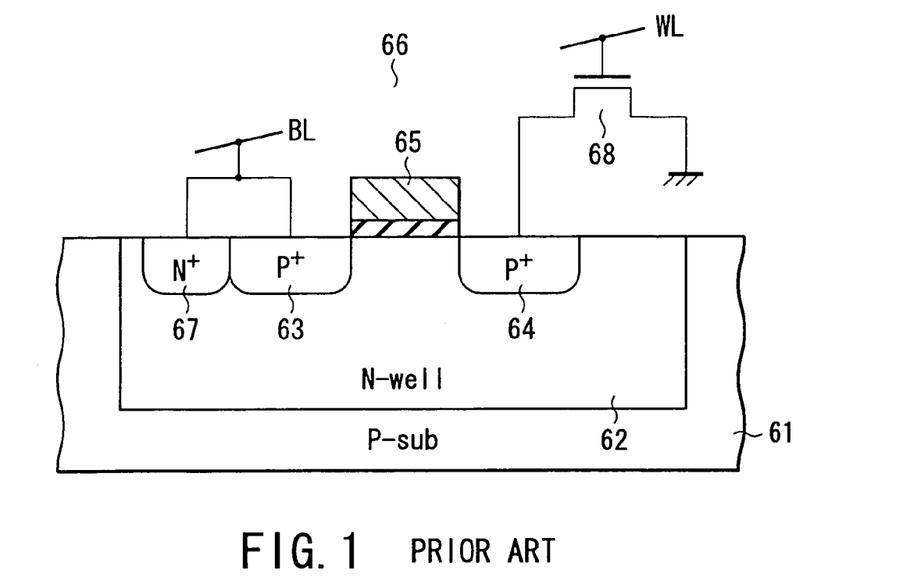
FIG. 1 is a cross-sectional view of a conventional memory cell.
Figure 2:
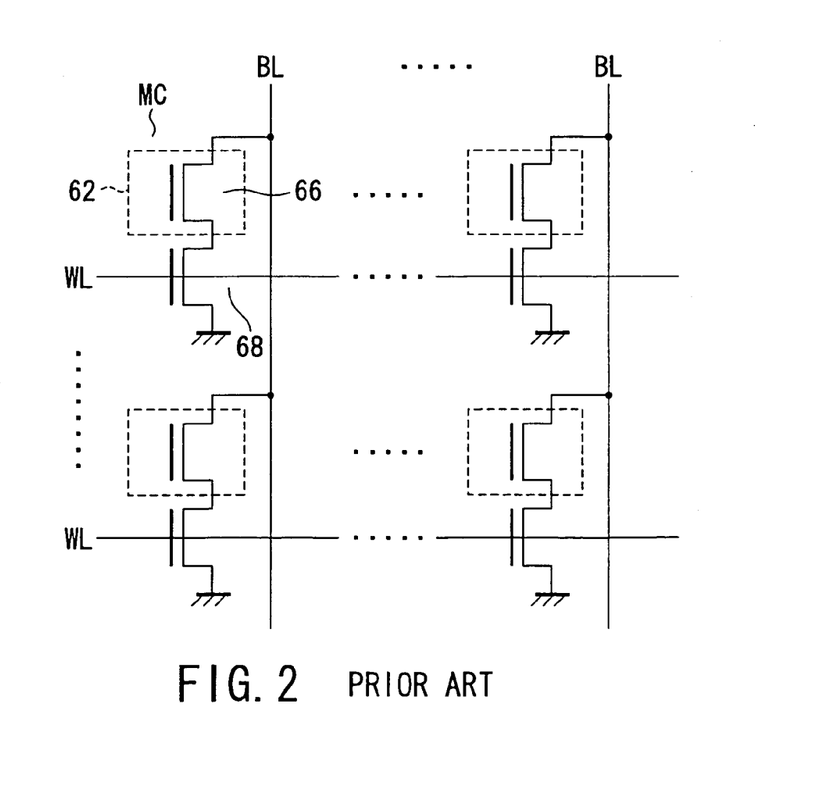
FIG. 2 is an equivalent circuit diagram of a memory cell array having the memory cell of FIG. 1.

A cross-sectional structure of a memory cell described in this reference is shown in FIG. 1 and an equivalent circuit of a memory array in which this plurality of memory cells of FIG. 1 are arranged is shown in FIG. 2.

As shown in FIG. 1, in a P type semiconductor substrate (P-sub) 61, a plurality of N type wells (only one of which is shown in the figure) 62 are formed. In each of the plurality of N type wells 62, a source region 63 and a drain region 64 which are made of a $P^+$ diffusion layer are formed. Further, a gate electrode 65 is formed on the substrate between the source and drain regions, to make up a cell transistor 66 constituted of a P-channel MOS transistor in each of the N type wells 62. The gate electrode 65 of the cell transistor 66 is not electrically connected anywhere so as to be in a floating potential state.

In each N type well 62, a contact region 67 made of an $N^+$ diffusion layer is formed which serves to make contact with the N type well. The contact region 67 is connected together with the source region 63 to a bit line BL. Further, the drain region 64 of the cell transistor is connected to a ground-potential node via a selection transistor 68 constituted of an N-channel MOS transistor. A gate electrode of the selection transistor 68 is connected to a word line WL.

The memory cell shown in FIG. 1 is formed many, to form a memory cell array shown in FIG. 2. In the memory cell array, the respective pluralities of word lines WL and bit lines BL extend in such a manner that they may cross. At each intersection of each word line WL and each bit line BL is there arranged each memory cell MC. Each memory cell MC has such a configuration that the cell transistor 66 whose gate electrode is not electrically connected anywhere so as to be in the floating potential state as described above and the selection transistor 68 are connected in series. It is to be noted that a region enclosed by a broken line in FIG. 2 corresponds to the N type well 62 in FIG. 1.

In the non-volatile semiconductor memory device, after a semiconductor chip is manufactured, an entire surface of the chip is irradiated with an ultraviolet light, to initialize the gate electrodes of the cell transistors 66 of all of the memory cells MC into a charge-less state so that the cell transistors 66 may have a predetermined constant negative threshold value.

To write data, the selected bit line BL is supplied with a voltage of, for example, 5V or so. This causes the N type well 62 connected to the selected bit line BL to be set to 5V or so simultaneously. Further, only the selected word line WL is provided with the "H" level potential to turn ON the selected transistor 68, so that 0V is transmitted to the $P^+$ diffusion layer, which is the drain region 64 of the cell transistor 66. In this case, the other word lines are connected to the ground level of 0V and the selection transistor 68 is turned OFF. In the selected cell transistor 66 placed at the intersection of the selected bit line and the selected word line, the N type well 62 and the source region 63 are each set to 5V or so, and the drain region 64 is set to 0V.

Upon application of the ultraviolet light, the threshold value of the cell transistor 66 is negative, so that the cell transistor 66 is in the ON state to flow a current between the drain region 64 and the source region 63, part of which current provides hot electrons, which pass through a gate insulation film of the cell transistor 66 and are injected into the gate electrode 65. This causes the threshold voltage of the cell transistor 66 to rise and turn positive. This state is defined, for example, as a "0" storage state.

In the cell transistor 66 into which no electrons are desired to be injected, the bit line BL connected to the cell transistor is set to 0V in potential beforehand so that the negative threshold voltage upon the application of the ultraviolet light may be maintained unchanged. This state is defined, for example, a "1" storage state.

To read the data, the selected bit line BL is supplied with a predetermined positive-polarity potential and the selected word line WL is also supplied with the predetermined positive polarity potential, to turn ON the selected transistor 68. If the gate electrode 65 of the cell transistor 66 has no electrons yet injected therein and stays as exposed to the ultraviolet light, the threshold voltage of the cell transistor 66 is of a negative polarity. Therefore, the cell transistors 66, which stays as exposed to the ultraviolet light, is turned to ON state, so that the current starts flowing through the bit line BL.

On the other hand, if the gate electrode 65 has electrons injected and data written beforehand and so its threshold voltage is shifted to the positive polarity, its cell transistor 66 is turned OFF, so that no current flows through the bit line BL.

In such a manner, when the data is read, in accordance with whether the data is written or not, the cell transistor is in the ON or OFF state respectively, in accordance with which in turn, the current flows or does not flow through the bit line BL respectively. Whether the current flows through the bit line BL or not is decided by a sense-amplifier, to detect whether the data is "0" or "1".

The non-volatile semiconductor memory device, however, has the following problems. The first problem is that it is not capable of electrical erasure. That is, it is designed to erase the data by applying the ultraviolet light and so needs to use a package provided with a window fitted with quartz glass which transmits the ultraviolet light, which package, however, is very expensive.

The second problem is that the N type well needs to be independently provided for each memory cell, so that the cell becomes large in area. Therefore, the memory device having such a large bit capacity cannot be formed in a semiconductor chip.

Therefore, there has conventionally been a demand for solving these problems.

BRIEF SUMMARY OF THE INVENTION

According to one aspect of the invention, there is provided a non-volatile semiconductor memory device comprises:

a selection transistor constituted of an MOS transistor having a gate electrode;

a source line connected to one end of the selection transistor;

a word line connected to the gate electrode of the selection transistor;

a cell transistor having a gate electrode which is not electrically connected anywhere so as to be in a floating potential state, one end of the cell transistor being connected to the other end of the selection transistor, the cell transistor being constituted of an MOS transistor having the same polarity as the selection transistor; and a bit line connected to the other end of the cell transistor.

According to another aspect of the invention, there is provided a non-volatile semiconductor memory device comprises:

a selection transistor constituted of an MOS transistor having a gate electrode;

a source line connected to one end of the selection transistor;

a word line connected to the gate electrode of the selection transistor;

a cell transistor having a gate electrode which is not electrically connected anywhere so as to be in a floating potential state, one end of the cell transistor being connected to the other end of the selection transistor, the cell transistor being constituted of an MOS transistor having the same polarity as the selection transistor; and a source line connected to the other end of the cell transistor.

DETAILED DESCRIPTION OF THE INVENTION

The following will describe in detail embodiments of the invention with reference to drawings.

FIRST EMBODIMENT

Figure 3:
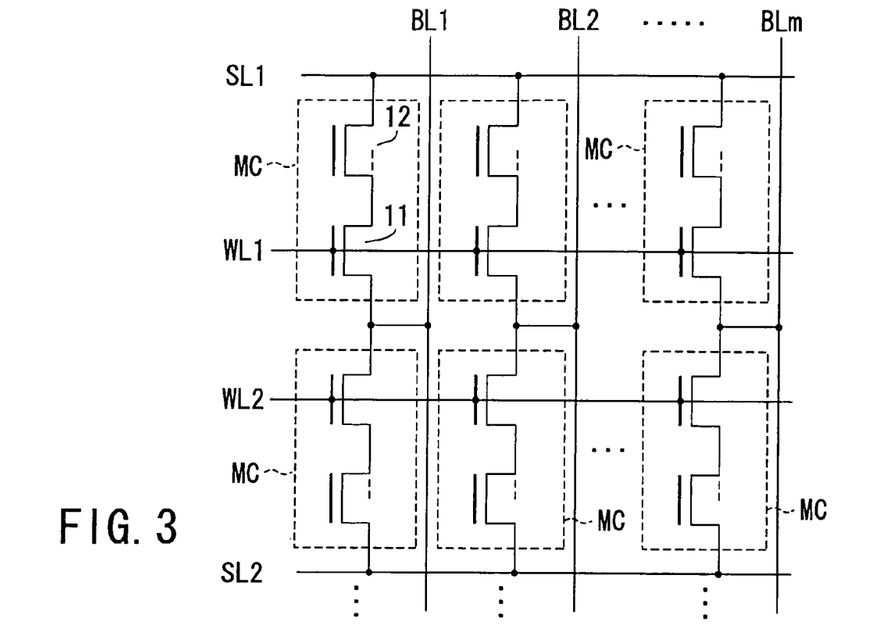
FIG. 3 is an equivalent circuit diagram which shows a configuration of part of a memory cell array of a non-volatile semiconductor memory device according to a first embodiment of the invention.

FIG. 3 is an equivalent circuit diagram which shows a configuration of part of a memory cell array of a non-volatile semiconductor memory device according to the first embodiment. As shown in it, a plurality of bit lines BL1, BL2 , . . . , BLm are arranged so as to extend in a first direction. Further, the respective pluralities of word lines and source lines are arranged so as to extend in a second direction which crosses the extension direction of the plurality of bit lines BL1, BL2 , . . . , BLm. It is to be noted that in FIG. 3, only the two word lines WL1 and WL2 and the two source lines SL1 and SL2 are shown.

At each intersection between each bit line BL and each source line SL, each memory cell MC is arranged. The memory cell MC has such a configuration that a selection transistor 11 constituted of an N-channel MOS transistor and a cell transistor 12 constituted of an N-channel MOS transistor are connected in series. A drain of the selection transistor 11 is connected to the corresponding bit line BL (either one of BL1, BL2 , . . . , and BLm), while a gate electrode thereof is connected to the corresponding word line WL (WL1 or WL2). To the source of the selection transistor 11 is there connected a drain of the cell transistor 12. A source of the cell transistor 12 is connected to the corresponding source line SL (SL1 or SL2).

In each of the cell transistors 12, at one portion of a region on the substrate on the side closer to the selection transistor 11, an $N^+$ diffusion layer is formed which has the same conductivity type as that of a source/drain of the N-channel MOS transistor. In FIG. 3, the $N^+$ diffusion layer is indicated by a broken line. A gate electrode of the cell transistor 12 is not electrically connected anywhere so as to be in the floating potential state.

It is to be noted that the memory cells are typically divided into a plurality of blocks, so that each of the blocks share the source line SL in wiring.

Figure 4:
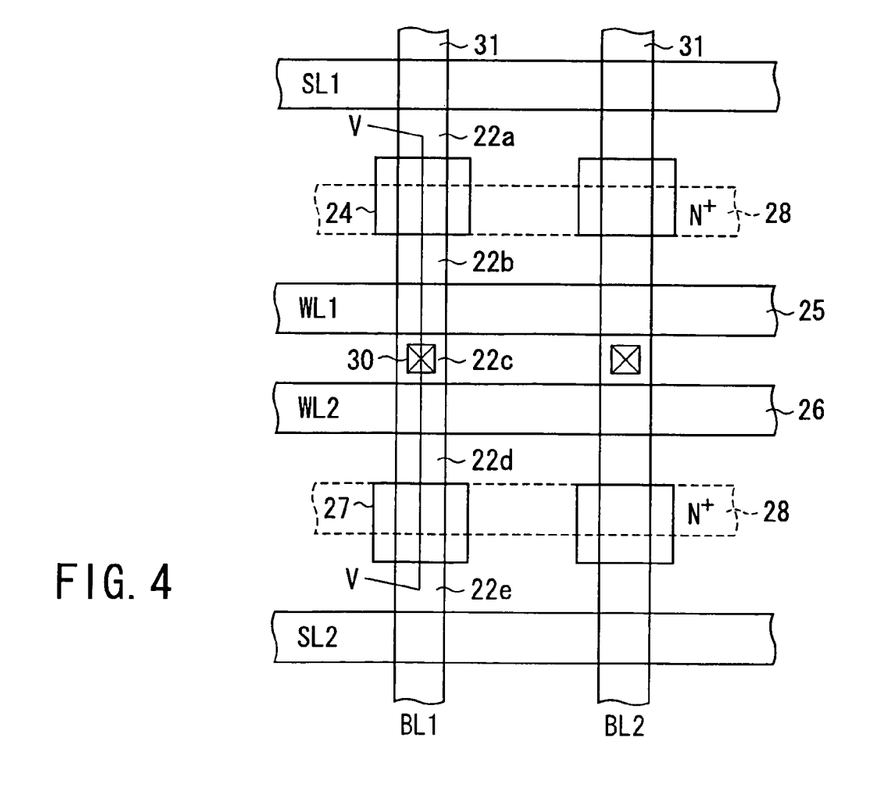
FIG. 4 is a pattern plan view which shows some memory cells extracted from the memory cell array of FIG. 3.
Figure 5:
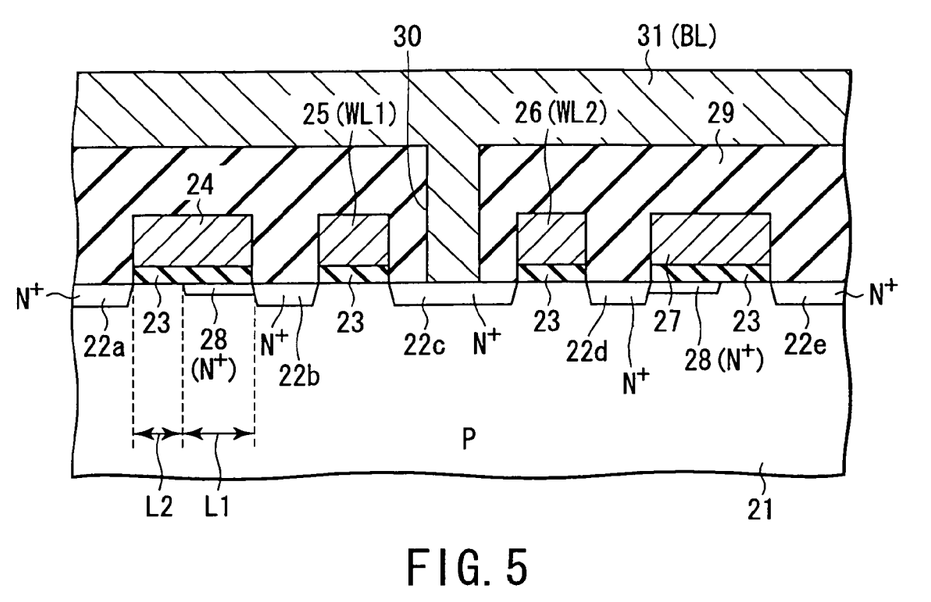
FIG. 5 is a cross-sectional view of FIG. 4.

As shown in a pattern plan view of FIG. 4 and a cross-sectional view of FIG. 5, in a P type semiconductor substrate (or P-well formed in an N type semiconductor substrate) 21, $N^+$ diffusion layers 22a–22e are formed as spaced from each other and as arranged in a row. The $N^+$ diffusion layer 22a constitutes a source region of the cell transistor 12. The $N^+$ diffusion layer 22b constitutes a drain region of the cell transistor 12 and a source region of the selection transistor 11. The $N^+$ diffusion layer 22c constitutes each of drain regions of the selection transistors 11 in the adjacent two memory cells that share the same bit line. The $N^+$ diffusion layer 22d constitutes the source region of the cell transistor 12 and the drain region of the selection transistor 11. The $N^+$ diffusion layer 22e constitutes the source region of the cell transistor 12.

The $N^+$ diffusion layers 22a and 22e extend laterally in FIG. 4, to provide the respective source lines SL1 and SL2 which are commonly wired to the respective pluralities of memory cells.

Between the $N^+$ diffusion layers 22a and 22b on the substrate 21, a gate electrode 24 obtained by patterning a conductive layer, for example, a polysilicon layer is formed via a gate insulation film 23. The gate electrode 24 is not electrically connected anywhere so as to be in the floating state.

Between the $N^+$ diffusion layers 22b and 22c on the substrate 21, a gate electrode 25 made of the same conductive layer as the gate electrode 24 is formed via a gate insulation film 23. The gate electrode 25 extends laterally in FIG. 4, to provide the word line WL1 which is commonly wired to the plurality of memory cells.

Similarly, between the $N^+$ diffusion layers 22c and 22d on the substrate 21, a gate electrode 26 made of the same conductive layer as the gate electrode 24 is formed via the gate insulation film 23. The gate electrode 26 extends laterally in FIG. 4, to provide the word line WL2 which is commonly wired to the plurality of memory cells.

Further, between the $N^+$ diffusion layers 22d and 22e on the substrate 21, a gate electrode 27 made of the same conductive layer as the gate electrode 24 is formed via the gate insulation film 23. The gate electrode 27 is not electrically connected anywhere so as to be in the floating state.

Furthermore, between the $N^+$ diffusion layers 22a and 22b, that is, in a surface region of the substrate 21 under the gate electrode 24, an $N^+$ diffusion layer 28 is formed in such a manner as to partially come in contact with the $N^+$ diffusion layer 22b. Similarly, between the $N^+$ diffusion layers 22d and 22e, that is, in a surface region of the substrate 21 under the gate electrode 27, an $N^+$ diffusion layer 28 is formed in such a manner as to partially come in contact with the $N^+$ diffusion layer 22d.

Further, on the entire surface including the gate electrodes 24–27 is there formed an inter-layer insulation film 29, in which a contact hole 30 is formed in such a manner as to expose part of the $N^+$ diffusion layer 22c, to fill which contact hole 30, further a wiring layer 31 is formed. The wiring layer 31 provides the bit line BL which extends in the direction crossing the extension direction of the gate electrodes 25 and 26.

Further, as shown in FIG. 5, a bit line-directional (extension direction of the wiring layer 31) dimension L1 of one portion of a channel region along which the $N^+$ diffusion layer 28, under the gate electrode 24, is formed is arranged to be larger than a bit line-directional dimension L2 of one portion of the channel region along which the $N^+$ diffusion layer 28 is not formed.

The following will describe operations of the non-volatile semiconductor memory device shown in FIG. 3.

Figure 6:
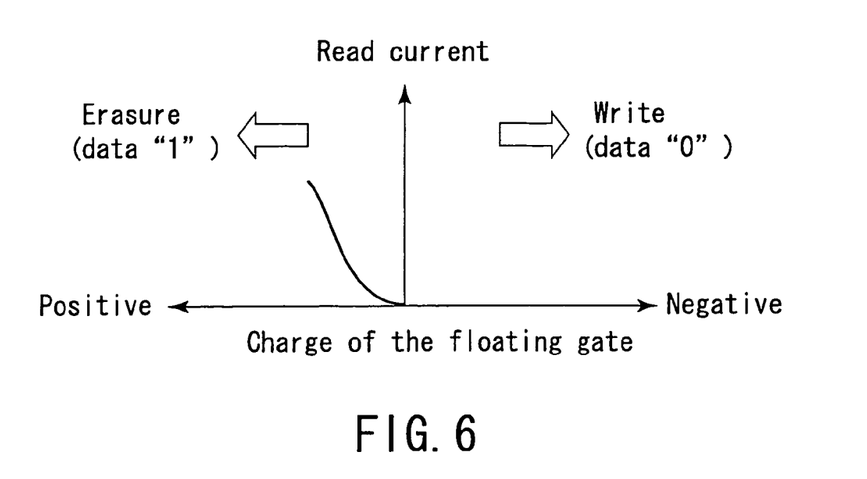
FIG. 6 is a diagram which shows transition states of a threshold value of a memory cell before and after programming in the non-volatile semiconductor memory device of FIG. 3.

Table 1 exemplifies voltages which are applied to the source line SL, word line WL and bit line BL to write (program), erase and read the data. FIG. 6 shows how the charge in the floating gate (gate electrode 24 or 27) of the memory cell changes before and after programming. More correctly, FIG. 6 illustrates how the current flowing from the bit line into the source line of the memory cell changes to read data from the memory cell.

FIG. 6 shows the charge that the floating gate has when a current flows through it. As seen from FIG. 6, the charge is determined by the impurity-concentration profile in the channel region of the transistor.

TABLE 1

|  | Source line | Selected word line | Selected bit line | Non-selected bit line |
| --- | --- | --- | --- | --- |
| Programming | 0 V | 6 V–4.5 V | 4.5 V | 0 V |
| Erasure | 7 V | Von | 0 V/1–2 V | 0 V |
| Reading | 0 V | Von | to 0.8 V | 0 V |

First, operation of the programming will be described. It is here supposed that after the semiconductor chip is manufactured, the electrons are emitted beforehand from the gate electrodes of the cell transistor 12, that is, the gate electrodes 24 and 27, so that the cell transistor 12 is ON state in reading. The initial state is defined to be a "1" storage state as shown in FIG. 6.

In programming, the selected bit line BL is supplied with a voltage of positive polarity, for example, 4.5V. The non-selected bit lines BL are supplied with 0V (ground voltage). To the selected word line WL to which the memory cell in which programming is desired is connected is supplied with such a voltage of 6V–4.5V to turn on the selection transistor 11. The non-selected word lines WL and source lines SL to which the non-selected selection transistors 11 are connected are supplied with 0V.

This causes the drain region of the cell transistor 12 of the selected memory cell to take on a voltage of 4.5V which is applied on the bit line BL. Further, a voltage of 0V applied on the source lines SL is transmitted to the source region of the cell transistor 12. Remember here that the $N^+$ diffusion layer 28 is formed at such one portion of the channel region of the cell transistor 12 as to be on the side of the selection transistor 11, so that between the $N^+$ diffusion layer 28 and the gate electrode 24 or 27, an n type MOS capacitor is formed. Therefore, when a voltage of 4.5V is applied on the drain region of the cell transistor 12, capacitive coupling due to the MOS capacitor causes a gate potential of the cell transistor 12 to rise, thereby turning on the cell transistor 12. This causes a current to flow between the source and the drain of the cell transistor 12, generating hot electrons. The hot electrons thus generated are injected from an edge on the side of the source region ($N^+$ diffusion layer 22a or 22e) or an edge on the side of the layer 28 of the cell transistor 12 into the gate electrode (gate electrode 24 or 27). Then, the cell transistor 12 that has been off in the initial state is turned off and comes to store "0."

That is, the charge in the floating gate of the cell transistor 12 changes to a negative value when the cell transistor 12 is programmed. The transistor 12 is therefore turned off. The charge in the floating gate of any cell transistor 12 not selected (that is, not programmed) remains unchanged.

Further, since the dimension L1 of the portion of the surface region under the gate electrode of the cell. transistor 12 along which the $N^+$ diffusion layer 28 is formed is larger than the dimension L2 of the portion along which the $N^+$ diffusion layer 28 is not formed, the cell transistor 12, when programming is performed therein, has stronger capacitive coupling between its drain region and gate electrode, so that it is possible to sufficiently raise the potential of the gate of the cell transistor 12, thereby improving a write efficiency.

Next, erasure operation of the data will be described.

On erasing the data, the source line SL is supplied with a positive polarity high-level voltage of, for example, 7V or so, and the selected word line WL to which the memory cell having the data to be erased is connected are supplied with a voltage Von as to turn on the selection transistor 11. Further, the bit line BL is supplied with 0V.

When the selected word line WL is thus supplied with the voltage Von, the selection transistor 11 is turned on, to provide a 0V output to the drain region of the cell transistor 12. The capacitive coupling between the drain region and the gate electrode of the cell transistor 12 in turn causes the gate potential of the cell transistor 12 to be lowered. The source region of the cell transistor 12, on the other hand, is supplied with the positive polarity high-level voltage from the source line SL. Electrons therefore move from the gate electrode into the source region ($N^+$ diffusion layer 22a or 22e) of the cell transistor 12, in the vicinity of an edge of the gate electrode of the cell transistor 12. The charge in the floating gate of the cell transistor 12 shifts to the positive side. The cell transistor 12 is therefore turned on. The initial state described above is recovered by thus pulling out the electrons from the gate electrode of the cell transistor 12.

In this case, a voltage of 7V is applied to all source lines, thereby to erase any page selected for a word line, provided that 7V is applied to only the word line selected and 0V is applied to the other word lines. This is because, if any cell transistor 12 selected is set at 0V, the diffusion layer at the drain side of the transistor 12 will be electrically floating and the potential will be transferred from the source of the transistor 12. As a result, the potentials of the channel- and drain-diffusion layers 28 rise to almost 7V. Then, the potential of the floating gate rises, too, by virtue of the capacitive coupling of the floating gate and drain-diffusion layer 28. Hence, no potential difference exists between the source-diffusion layer and the floating gate, and the date cannot be erased in the cell transistor 12.

The data is erased in units of a block if only one source line SL is supplied with an erasure voltage of 7V and in units of a page if all the source lines SL are supplied with the erasure voltage concurrently. It is thus possible to select block-unit erasure or page-unit erasure.

Next, reading operation of the data will be described.

In reading the data, the selected bit line BL to which the memory cell to be subject to reading is connected is supplied with a reading voltage. The reading voltage is, for example, 0.8V or so. Further, the word line WL to which the memory cell to be subject to the reading is connected is supplied with such a voltage Von as to turn on the selection transistor 11. The voltage Von takes on, for example, 2V or so. The non-selected bit lines BL are supplied with the voltage of 0V. Further, all the source lines SL are supplied with 0V.

When the selection transistor 11 is thus turned on, the reading voltage is transmitted to the drain region of the cell transistor 12 in the selected memory cell. Further, the voltage of 0V applied on the source lines SL is transmitted up to the source region of the cell transistor 12.

If the memory cell selected is storing "1," that is, if the charge in the gate of the cell transistor 12 is equal to or greater than a positive value, the cell transistor 12 is turned on. In this case, a current flows through the transistor 12 to the bit line BL. If the memory cell selected is storing "0," that is, if the cell has been programmed or the charge in the gate of the cell transistor 12 is equal to or less than a negative value, the cell transistor 12 is turned off. No current therefore flows through the transistor 12 to the bit line BL. Whether the current flows through the bit line BL or not is decided by a sense-amplifier not shown, to detect the "1" or "0" state of the data.

In the memory cell, the potential of the gate electrode in the floating potential state is raised by capacitive coupling at the time of writing the data, so that a degree of write varies with a coupling value between the $N^+$ diffusion layer 28 and the gate electrode. Therefore, for the data writing, the data is written in the memory cell for a predetermined time, and immediately after the writing, reading operation is performed.

A voltage of 4.5V is applied to any bit line to which any cell to which data has not been completely written is connected. A voltage of 0V is applied to any bit line to which any cell to which data has been completely written is connected. Then, the writing operation is performed again, and the writing operation and the reading operation are repeated until the charge amount of the gate electrode of the cell transistor 12 falls within the predetermined range. Such operations are generally referred to as "verification".

Also in the case of the first embodiment, when the data is written, the writing verification may be performed. The writing verification shortens the time required to write data and prevents excessive writing of data.

It is thus possible to erase the data electrically in the non-volatile semiconductor memory device of the first embodiment. Further, the cell area ca be made relatively small because it is not necessary to provide the N type well independently for each memory cell as in the case of the conventional technologies.

SECOND EMBODIMENT

Figure 7:
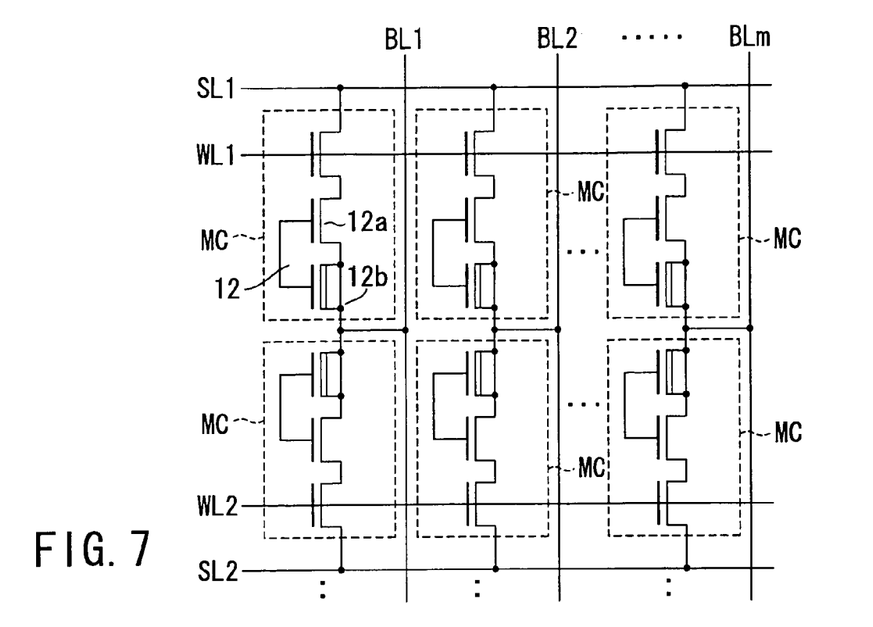
FIG. 7 is an equivalent circuit diagram which shows a configuration of part of a memory cell array of a non-volatile semiconductor memory device according to a second embodiment of the invention.

FIG. 7 is an equivalent circuit diagram which shows a configuration of part of a memory cell array of a non-volatile semiconductor memory device according to a second embodiment. In the second embodiment also, as in the case of the first embodiment, the respective pluralities of bit lines, word lines, and source lines are arranged in such a configuration that a memory cell MC is placed at an intersection between each bit line BL and each source line SL. Further, each memory cell MC has such a configuration that a selection transistor 11 constituted of an N-channel MOS transistor and a cell transistor 12 constituted of an N-channel MOS transistor are connected in series.

A source region of the selection transistor 11 is connected to the corresponding source line SL (SL1 or SL2), while a gate electrode thereof is connected to the corresponding word line WL (WL1 or WL2). To a drain of the selection transistor 11 is there connected a source of the cell transistor 12. A drain of the cell transistor 12 is connected to the corresponding bit line BL (either one of BL1, BL2, ..., and BLm).

In the cell transistor 12, an N+ diffusion layer is formed in a surface region of a substrate 21 on the side closer to the bit line BL, while a gate electrode thereof is not electrically connected anywhere so as to be in a floating potential state. The cell transistor 12, therefore, is shown to comprise an MOS transistor 12a and an n type MOS capacitor 12b connected between a gate electrode and a drain of the MOS transistor 12a.

Figure 8:
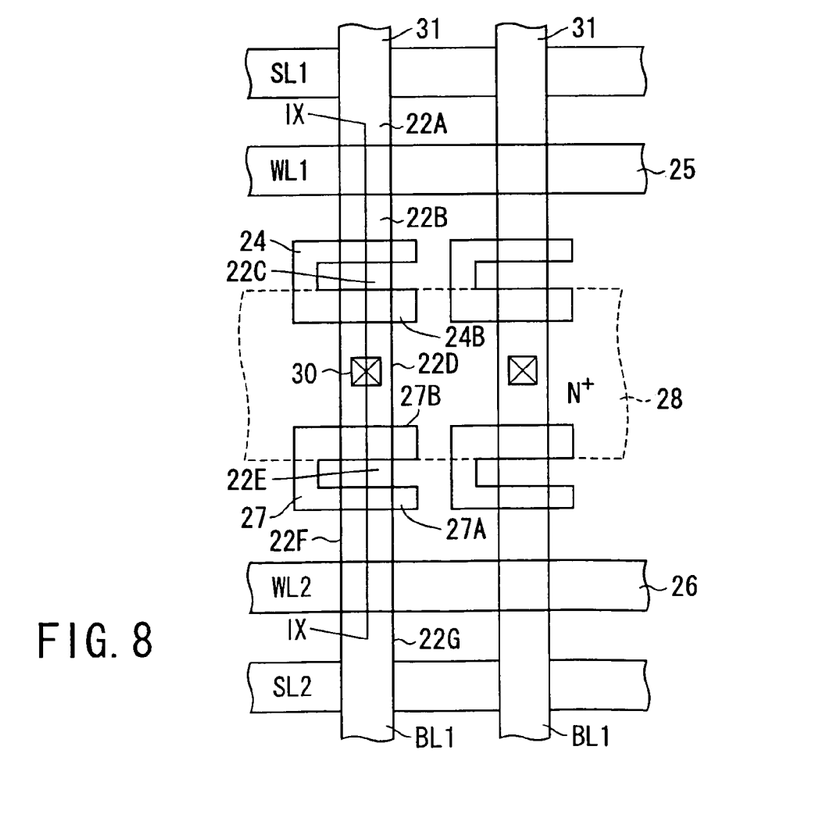
FIG. 8 is a pattern plan view which shows some memory cells extracted from the memory cell array of FIG. 7.
Figure 9:
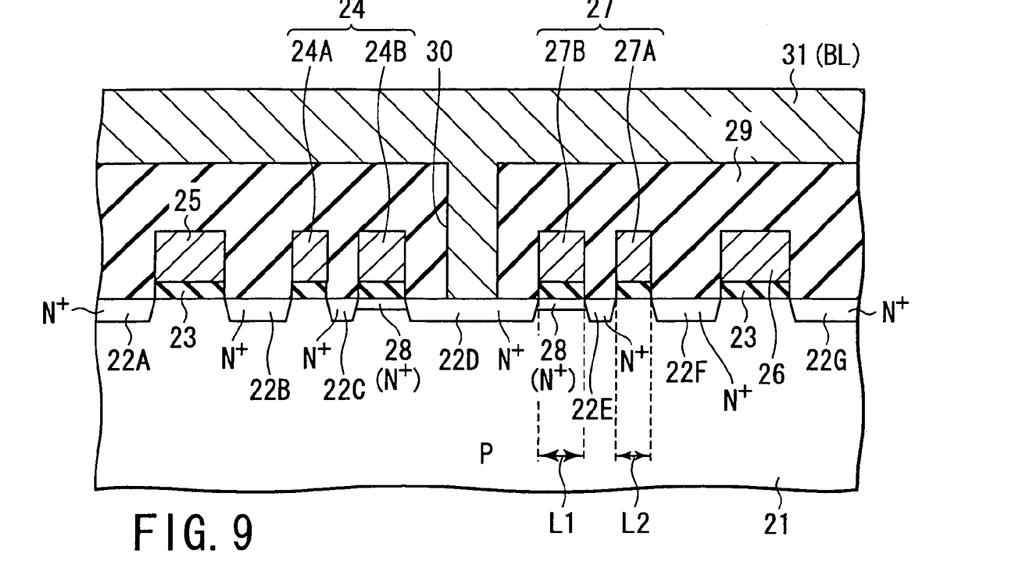
FIG. 9 is a cross-sectional view of FIG. 8.

As shown in a pattern plan view of FIG. 8 and a cross-sectional view of FIG. 9, in a P type semiconductor substrate (or P-well formed in an N type semiconductor substrate) 21, N+ diffusion layers 22A–22G are formed as spaced from each other and as arranged in a row. The N+ diffusion layer 22A constitutes a source region of the selection transistor 11. The N+ diffusion layer 22B constitutes a drain region of the selection transistor 11 and a source region of the cell transistor 12. The N+ diffusion layer 22C constitutes a drain region of the MOS transistor 12a. The N+ diffusion layer 22D corresponds to one end of the MOS capacitor 12b in the adjacent two memory cells which share the bit line.

The N+ diffusion layer 22E constitutes the drain region of the MOS transistor 12a. The N+ diffusion layer 22F constitutes a source region of the MOS transistor 12a and the drain region of the selection transistor 11. The N+ diffusion layer 22G constitutes the source region of the selection transistor 11.

The N+ diffusion layers 22A and 22G extend laterally in FIG. 8, to provide the source lines SL1 and SL2 respectively which are commonly wired to the plurality of memory cells.

Between the N+ diffusion layers 22A and 22B on the substrate 21, a gate electrode 25 obtained by patterning a conductive layer, for example, a polysilicon layer is formed via a gate insulation film 23. The gate electrode 25 extends laterally in FIG. 8, to provide the word line WL1 which is commonly wired to the plurality of memory cells. Similarly, between the N+ diffusion layers 22F and 22G on the substrate 21, a gate electrode 26 made of the same conductive layer as the gate electrode 25 is formed via the gate insulation film 23. The gate electrode 26 extends laterally in FIG. 8, to provide the word line WL2 which is commonly wired to the plurality of memory cells.

Further, between the N+ diffusion layers 22B and 22C on the substrate 21, a gate electrode 24A made of the same conductive layer as the gate electrode 25 is formed via the gate insulation film 23. Between the N+ diffusion layers 22C and 22D on the substrate 21, a gate electrode 24B made of the same conductive layer as the gate electrode 25 is formed via the gate insulation film 23. The gate electrodes 24A and 24B are interconnected to provide one gate electrode 24 having a U-shaped plane geometry.

Similarly, between the N+ diffusion layers 22D and 22E on the substrate 21, a gate electrode 27B made of the same conductive layer as the gate electrode 25 is formed via the gate insulation film 23. Between the N+ diffusion layers 22E and 22F on the substrate 21, a gate electrode 27A made of the same conductive layer as the gate electrode 25 is formed via the gate insulation film 23. The gate electrodes 27B and 27A are interconnected to provide one gate electrode 27 having a U-shaped plane geometry.

Furthermore, an N+ diffusion layer 28 is formed in the surface region between the N+ diffusion layers 22C and 22D and between the N+ diffusion layers 22D and 22E.

As shown in FIG. 9, a bit line-directional (extension direction of a wiring layer 31) dimension L1 of one portion of the surface region of the substrate along which the N+ diffusion layer 28 is formed is arranged to be larger than a bit line-directional dimension L2 of one portion of the channel region along which the N+ diffusion layer 28 is not formed.

Further, on the entire surface of the gate electrodes is there formed an inter-layer insulation film 29, in which a contact hole 30 is formed in such a manner as to expose part of the N+ diffusion layer 22D, to fill which contact hole 30, further a wiring layer 31 is formed. The wiring layer 31 provides the bit line BL which extends in the direction crossing the extension direction of the gate electrodes 25 and 26.

The following will describe operations of the non-volatile semiconductor memory device shown in FIG. 7.

Table 2 exemplifies voltages which are applied to the source line SL, word line WL and bit line BL to write (program), erase and read the data.

TABLE 2

|  | Source line | Selected word line | Selected bit line | Non-selected bit line |
|---|---|---|---|---|
| Programming | 0 V | Von | 4.5 V | 0 V |
| Erasure | 7 V | 7 V | 0 V/1–2 V | 0 V |
| Reading | 0 V | Von | to 0.8 V | to 0.8 V |

First, operation of programming will be described. It is here supposed that after the semiconductor chip is manufactured, the electrons are emitted beforehand from the gate electrodes of the cell transistor 12, that is, the gate electrodes 24 and 27, so that the MOS transistor 12a is ON state in reading. The initial state is defined to be a "1" storage state.

In programming, the selected bit line BL is supplied with a voltage of positive polarity, for example, 4.5V. The non-selected bit lines BL are supplied with 0V. The selected word line WL to which the memory cell in which programming is desired is connected is supplied with such a voltage Von as to turn on the selection transistor 11, for example, 2V. The non-selected word lines WL and source lines SL to which the non-selected selection transistors 11 are connected are supplied with 0V.

This causes the voltage of 0V of the source line SL to be transmitted to the source region of the MOS transistor 12a of the selected memory cell. Further, one of the electrodes of the MOS capacitor 12b of the selected memory cell, that is, the N+ diffusion layer 28 is supplied with the voltage of 4.5V applied on the bit line BL. Further, the voltage of 4.5V applied on the bit line BL is transmitted up to the drain region (N+ diffusion layer 22C or 22E) of the MOS transistor 12a. In this condition, capacitive coupling due to the MOS capacitor 12b causes a gate potential of the MOS transistor 12a to rise, thereby turning on the MOS transistor 12a. This causes a current to flow between the source and the drain of the MOS transistor 12a, thereby generating hot electrons. The hot electrons thus generated are injected from an edge on the side of the source region (N+ diffusion layer 22B or 22F) or an edge on the side of the drain region (N+ diffusion layer 22E or 22C) of the MOS transistor 12a into the gate electrode (gate electrode 24 or 27). Then, the MOS transistor 12a that has been on in the initial state is turned off. After the shift, a "0" storage state is entered.

That is, when implementing programming in the memory cell 12, the MOS transistor 12a that has been on in the initial state is turned off. The MOS transistor 12a in each of the non-selected memory cells 12 in which no programming is ON state.

Further, since the bit line-directional dimension L1 of the portion in the surface region of the substrate along which the $N^+$ diffusion layer 28 is formed is larger than the bit line-directional dimension L2 of the portion of the channel region along which the $N^+$ diffusion layer 28 is not formed, when programming is performed in the cell transistor, capacitive coupling becomes stronger, so that it is possible to sufficiently raise the gate potential of the MOS transistor 12a, thereby improving a write efficiency.

Next, operation of data erasure will be described.

In erasing data, the source line SL, and the selected word line WL to which the memory cell desired to be subject to the data erasure is connected are supplied with a positive polarity high-level voltage of, for example, 7V or so. Further, the bit line BL is supplied with 0V. In this case, it is necessary to actuate the selected word line WL and the source line SL simultaneously. This is because the gate insulation film of the selection transistor 11 can be prevented from broken down by raising the voltage of the channel region and that of the gate electrode of the selection transistor 11 simultaneously.

When the bit line BL is thus supplied with 0V, the capacitive coupling due to the MOS capacitor 12b causes the gate potential of the MOS transistor 12a to be lowered. This in turn causes, in the vicinity of an edge of the gate electrode of the MOS transistor 12a, electrons to be pulled out from the gate electrode into the source region ($N^+$ diffusion layer 22B or 22F), so that the MOS transistor 12a is ON sate. The initial state described above is recovered by thus pulling out the electrons from the gate electrode of the MOS transistor 12a.

In this case, the data is erased in units of a block if only one source line SL is supplied with an erasure voltage of 7V and in units of a page if all the source lines SL are supplied with the erasure voltage concurrently. It is thus possible to select block-unit erasure or page-unit erasure. The page-unit erasure can be selected by setting the word line at a potential of 7V or less.

Next, reading operation of the data will be described.

On reading the data, the selected bit line BL to which the memory cell having the data to be read is connected is supplied with a reading voltage. The reading voltage is, for example, 0.8V or so. Further, the word line WL to which the memory cell to be subject to the reading is connected is supplied with such a voltage Von as to turn on the selection transistor 11. The voltage Von takes on, for example, 2V or so. The non-selected bit lines BL are supplied with the voltage of 0V. Further, all the source lines SL are supplied with 0V.

When the selection transistor 11 is thus turned on, the voltage of 0V is transmitted to the source region of the MOS transistor 12a in the selected memory cell. Further, the reading voltage applied on the selected bit line BL is transmitted via one electrode of the MOS capacitor 12b in the selected memory cell, that is, the $N^+$ diffusion layer 28 up to the drain region of the MOS transistor 12a, that is, the $N^+$ diffusion layer 22C or 22E.

If the memory cell selected is storing "1," that is, if the charge in the gate of the cell transistor 12 has a positive value equal to or greater than a predetermined value, the transistor 12 is turned on and a current flows through the transistor 12 to the bit line BL. If the memory cell selected is storing "0," that is, if this cell has been programmed and the charge in the gate of the transistor 12 has a negative value equal to or less than a predetermined value, the transistor 12 is turned off. In this case, no current flows through the cell transistor 12 to the bit line BL. A sense amplifier determines whether the current flows through the bit line BL. Thus, data "1" or data "0" is detected.

In the case of the second embodiment also, in each memory cell, when writing the data, the potential of the gate electrode in the floating potential state is caused to rise by capacitive coupling, so that a degree of the writing varies with a condition of coupling due to the MOS capacitor 12b. Therefore, when the data is written, such writing verification as described above needs to be carried out.

It is thus possible to erase the data electrically also in the non-volatile semiconductor memory device of the second embodiment. Further, the cell area ca be made relatively small because it is not necessary to provide the N type well independently for each memory cell as in the case of the conventional technologies.

Although the first and second embodiments have been described with reference to the case where in erasing the data, the voltage of 0V is applied to the selected bit line, this application voltage may be replaced by a voltage of positive polarity which is slightly higher than 0V, for example, 1–2V as shown in Tables 1 and 2. In erasing the data, the voltage of positive polarity is applied to the selected bit line, so that the cell transistor 12 or the MOS transistor 12a is turned off, because the bit line has the voltage of positive polarity even if the electrons in the gate electrode of the cell transistor 12 in FIG. 3 or the MOS transistor 12a in FIG. 7 are pulled out into the source line to cause the charge of the gate of the cell transistor is shifted to a negative side. As a result, in the erasure mode, it is possible to prevent a current from flowing from the source line to the bit line.

FIRST MODIFICATION OF SECOND EMBODIMENT

The following will describe a first modification of the second embodiment.

Figure 10:
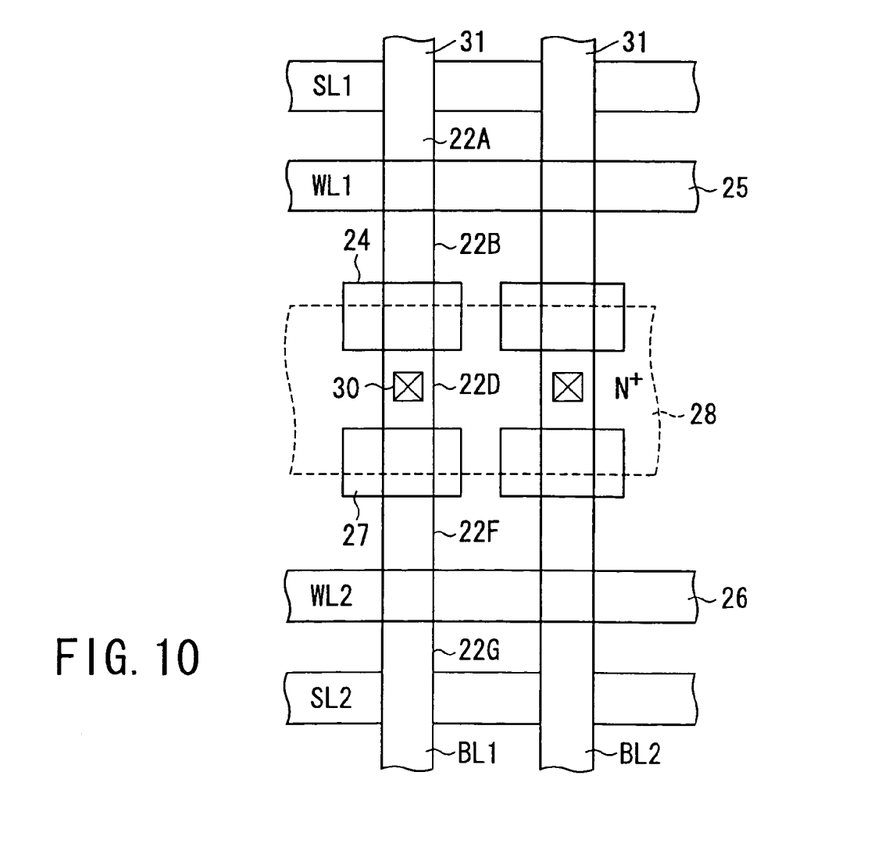
FIG. 10 is a pattern plan view which shows some memory cells extracted from an inside of a memory cell array according to a first modification of the second embodiment.

FIG. 10 is a pattern plan view which shows some memory cells extracted from the memory cell array shown in FIG. 7. Components in FIG. 10 which corresponds to those in the pattern plan view of FIG. 8 are indicated by the same reference symbols and their explanation is omitted, to describe only the different components below.

The gates electrodes 24 and 27 of the cell transistor 12 have been described to each have the U-shaped plane geometry as shown in FIG. 8, in contract to which, however, in the case of the first modification, the gates 24 and 27 of the cell transistor 12 are rectangular in geometry. That is, in contrast to FIG. 8, the $N^+$ diffusion regions 22C and 22E are omitted, so that the region where these $N^+$ diffusion regions 22C and 22E have been present makes part of a channel region of the cell transistor 12. Further, an $N^+$ diffusion region 28 is formed at one portion in a surface region of a substrate of the cell transistor 12 on the side of a bit line.

In this case also, a bit line-directional dimension of one portion of a surface region of the substrate under the gate electrodes 24 and 27 along which the $N^+$ diffusion layer 28 is formed is larger than the bit line-directional dimension of the portion along which the $N^+$ diffusion layer 28 is not formed. That is, a length of an MOS capacitor that corresponds to a channel region of an MOS transistor is arranged to be larger than the MOS transistor so that capacitive coupling due to the MOS capacitor may become stronger in the programming mode.

A non-volatile semiconductor memory device of the first modification gives the same effects as those in the case of the second embodiments and, besides, an effect of reducing a cell area by as much as an eliminated region where the N+ diffusion layers 22C and 22E have been formed between the MOS transistor and the MOS capacitor.

SECOND MODIFICATION OF SECOND EMBODIMENT

The following will describe a second modification of the second embodiment.

Figure 11:
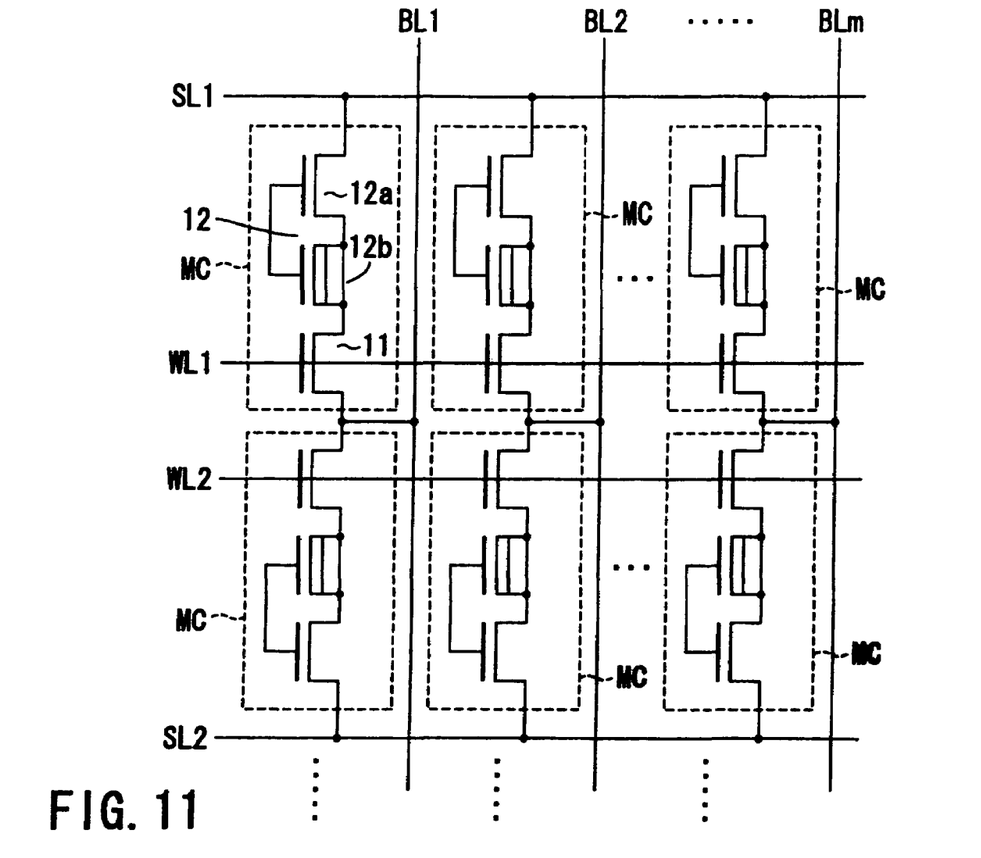
FIG. 11 is an equivalent circuit diagram which shows a configuration of part of a memory cell array of a non-volatile semiconductor memory device according to a second modification of the second embodiment.

Although the second embodiment has been described with reference to the case where in each memory cell MC the selection transistor 11 is arranged on the side of the source line and the cell transistor 12 is arranged on the side of the bit line, in the second modification, as shown in FIG. 11, they may be arranged opposite to the second embodiment, that is, in each memory cell MC the selection transistor 11 may be arranged on the side of the bit line and the cell transistor 12, on the side of the source line.

The second modification also gives the same effects as those by the second embodiment.

It is to be noted that, in the second modification, rather than dividing each source line into two, they may be interconnected into a common source line in a memory cell array, to which a source voltage generation circuit is to be connected from an end of the memory cell array not via a decoding transistor. The source voltage generation circuit generates variety values of source voltages as shown in Tables 1 and 2 in data write/erasure/read in the memory cell. In the configuration, a film thickness of a gate insulation film under a gate electrode of an MOS transistor in the source voltage generation circuit is made equivalent to that of the gate insulation film under the gate electrode of the MOS transistor in the memory cell.

By thus connecting the source voltage generation circuit to the common source line not via the decoding transistor, the following effect can be obtained. That is, in erasure, the source line is supplied with a high-level voltage. To withstand the high-level voltage, the decoding transistor, if provided, must have a thick gate oxide film. A transistor having such a thick gate oxide film needs to be formed separately if not formed in a logic circuit, so that a relevant non-volatile semiconductor memory device cannot be manufactured by processes compatible with those for the logic circuit. If there is no decoding transistor in the device, there is no need to form a transistor having the thick gate oxide film.

Remember that in the non-volatile semiconductor memory devices according to the embodiments and the modifications, each memory cell essentially comprises the two MOS transistors, the gate electrodes of both of which can be formed by patterning the same conductive layer, for example, polysilicon layer. Therefore, when, as shown in a block diagram of FIG. 12, a non-volatile semiconductor memory device 100 including the memory cell array shown in FIGS. 3, 7, and 11 is to be integrated in the same semiconductor chip together with a peripheral logic circuit 200 comprised of the logic circuits, it is possible to simultaneously form the gate electrodes of both of the transistors in the memory cell MC and the gate electrodes of the MOS transistors formed in the peripheral logic circuit 200 by using the same conductive layer. It is to be noted that the peripheral logic circuit 200 includes an address decoder circuit which selects the memory cell in the non-volatile semiconductor memory device 100, a sense-amplifier, a data input/output circuit, a sequence control circuit which controls write/erasure/read operations, and arithmetic circuits, for example, a CPU and a DSP circuit.

The following will roughly describe manufacturing processes which are employed to integrate the memory cells in the memory cell array shown in FIGS. 3, 7, and 11 in the same semiconductor chip together with the peripheral logic circuit having an output transistor (logic I/O) required to have a high breakdown voltage and a transistor for logic operations (logic transistor) required to have a high operating speed.

Figure 13A:
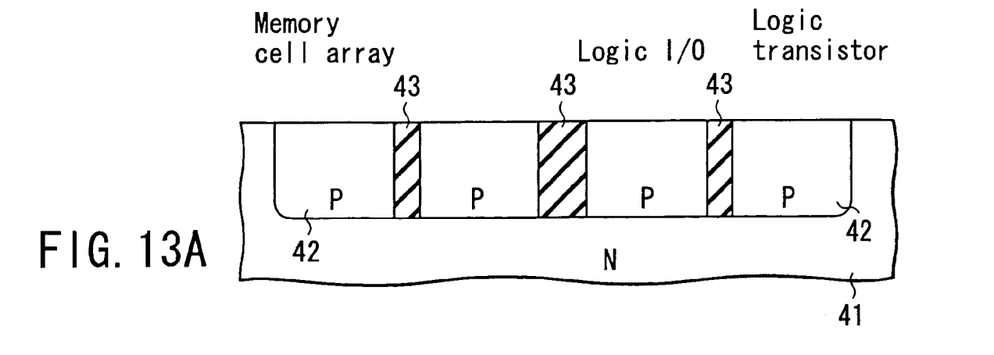
FIGS. 13A–13G are cross-sectional views which show steps of manufacturing the semiconductor chip shown in FIG. 12.

First, as shown in FIG. 13A, after a plurality of P type well regions 42 are formed in an N type semiconductor substrate 41, element-isolating trenches are formed in the substrate 41 and filled with an oxide film to form an element isolation region 43.

Figure 13B:
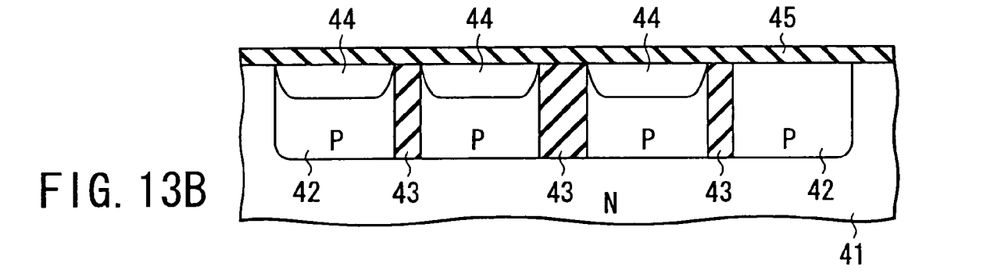

Next, as shown in FIG. 13B, an impurity is diffused into a channel region 44 in which the memory cell array and the logic I/O of the logic circuit are expected to be formed, after which a first oxide film 45 is formed on an entire surface by deposition etc. The oxide film 45 provides gate insulation films of the memory cell transistor and the logic I/O, having a film thickness in a range of, for example, 5–13 nm.

Figure 13C:
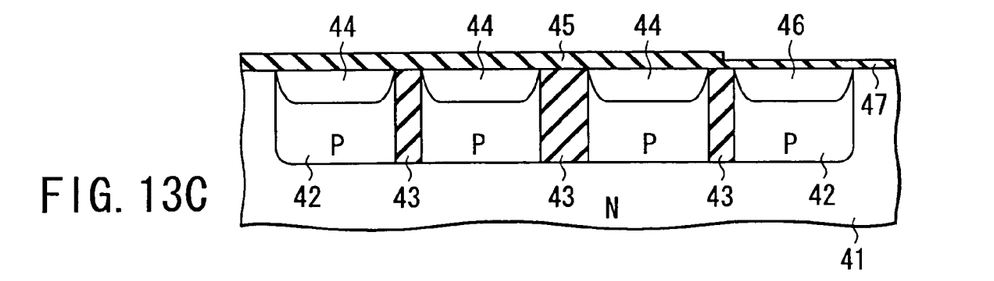

Then, as shown in FIG. 13C, after the first oxide film 45 on the region where the logic transistor required to be high in operating speed is etched off selectively to form a channel region 46, into which an impurity is diffused, after which a second oxide film 47 is formed on the entire surface by deposition etc. The second oxide film 47 provides a gate insulation film of the logic transistor, having a thickness smaller than the first oxide film 45.

Figure 13D:
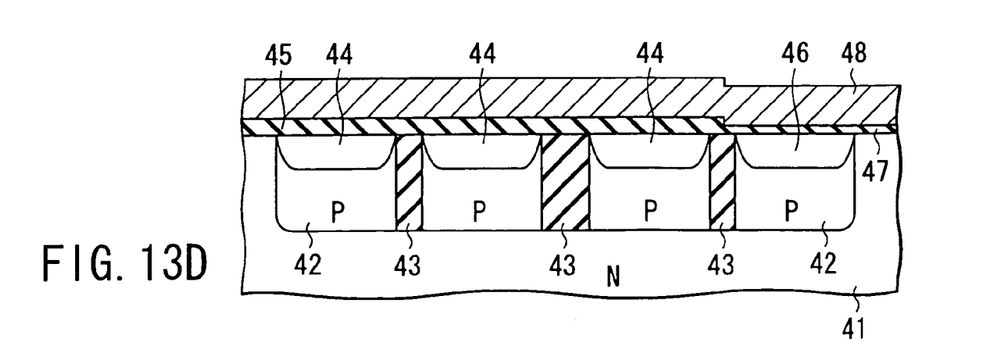

Next, as shown in FIG. 13D, a conductive layer 48 to form the gate electrodes is deposited on the entire surface. As the conductive layer 48, a polysilicon layer is used, for example.

Figure 13E:
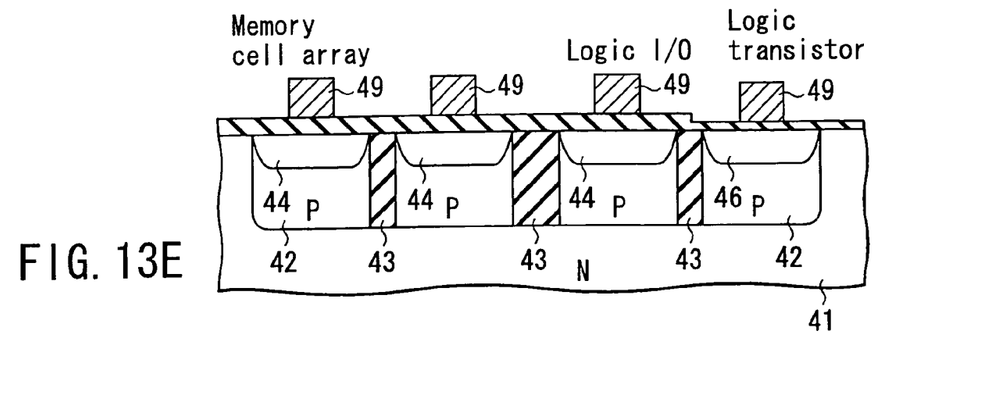

Subsequently, as shown in FIG. 13E, the conductive layer 48 is patterned to process the gate, thereby forming a gate electrode 49. In this case, the gate insulation films of the gate electrodes 49 of the transistor in the memory cell array and the logic I/O in the logic circuit are each constituted of the first oxide film 45, and they have the same film thickness.

Figure 13F:
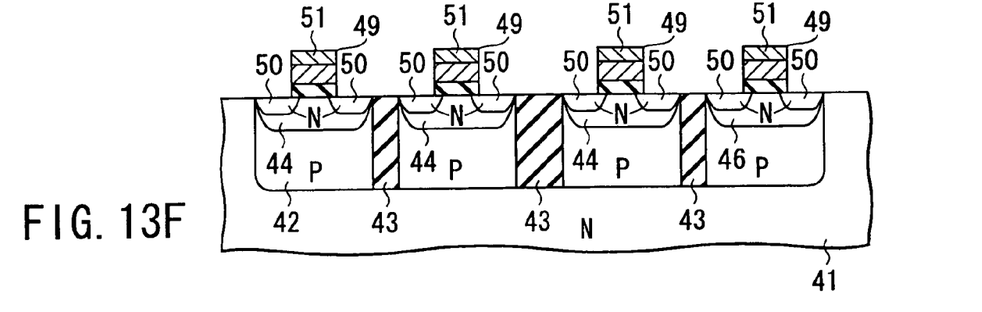

Next, as shown in FIG. 13F, using the gate electrode 49 as a mask, an N type impurity is introduced into the substrate 41 to form a source/drain diffusion region 50 of each of the transistors. In this case, the N type impurity is injected also into a surface of each of the gate electrodes 49, to form an impurity injected region 51.

The N+ diffusion layer 28 in the MOS capacitor described above is formed by diffusing the N type impurity into an MOS capacitor region simultaneously when the impurity is diffused into the channel region 44 of the region where the memory cell array and the logic I/O of the logic circuit are expected to be formed or by doping the N type impurity through the gate electrode into the MOS capacitor region by high acceleration-voltage ion injection after the gate electrode is processed.

Figure 13G:
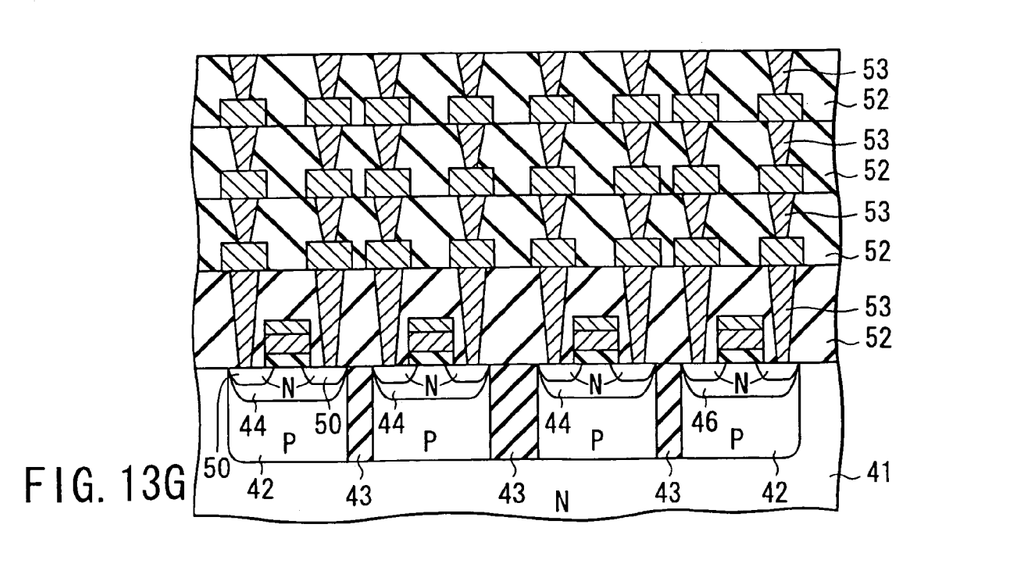

Then, a shown in FIG. 13G, an inter-layer insulation film 52 is deposited, so that in the inter-layer insulation film 52, a contact hole which extends to a surface of the source/drain diffusion region 50 is made and filled so as to form a conductive layer 53, thereby drawing out a terminal from each source/drain diffusion region 50. By stacking the inter-layer insulation film 52 as many as necessary, a multi-layer wiring construction is formed.

A P-type well or an N-type well can be formed in the P-type silicon substrate, by using the ordinary process of manufacturing logic chips. The well may be either deeper or shallower than the element-isolating trench.

An ordinary CMOS-logic process may replace the method shown in FIGS. 13A to 13G. In the process, memory cells are formed at the same time the NMOS transistor is fabricated. To form the memory cells it suffices to dope a region with impurities, which lies beneath the gate electrode of the NMOS transistor and which the bit lines are connected.

Figure 12:
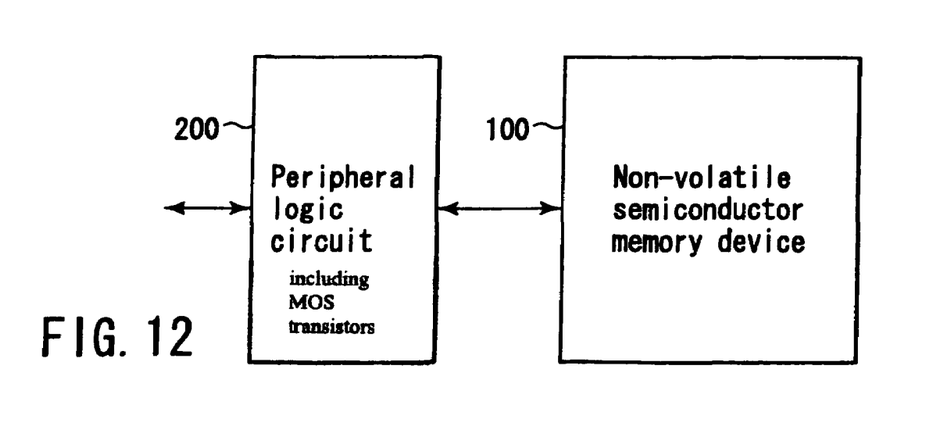
FIG. 12 is a block diagram which shows a semiconductor chip into which are integrated a peripheral logic circuit and the non-volatile semiconductor memory device including the memory cell array according to the first and second embodiments as well as the first and second modifications of the second embodiment.

According to such a method, it is possible to manufacture the memory cell and the transistor in the peripheral logic circuit 200 in the non-volatile semiconductor memory device 100 by the same manufacturing process. That is, in comparison to the case where a conventional non-volatile semiconductor memory device using stack gate structure transistors, the process is greatly simplified, with few differences in manufacturing costs from the ordinary MOS type semiconductor memory device not including the memory cell array.

Of course the invention is not limited to the embodiments and the modifications described above and can be modifies in a variety of manners. For example, the embodiments and the modifications have been described in the case where the selection transistor and the cell transistor in the memory cell are each constituted of an N-channel MOS transistor, but they may be each constituted of a P-channel MOS transistor.

An equivalent circuit of the memory cell in the case where the P-channel MOS transistor is used is such as shown in FIGS. 3, 7, and 11, in which the N-channel MOS transistor is only replaced by the N-channel MOS transistor.

In a case where the P-channel MOS transistor is used as the selection transistor and the cell transistor, the selection transistor and the cell transistor are formed in an N type well provided in a P type semiconductor substrate. In this case, the gate electrodes of the selection transistor and the cell transistor are formed using the same conductive layer as in the case where the N-channel MOS transistor is used. Furthermore, a P$^+$ diffusion layer is formed partially in the channel region of the cell transistor.

In the memory cell using the P-channel MOS transistor, a voltage is applied two ways in programming the data.

By a first method, the N type well and the source line are supplied with 0V, the word line is supplied with such a voltage as to turn on the selected transistor constituted of a P-channel MOS transistor, for example, 0V, and the bit line is supplied with a negative polarity voltage, for example, −5V.

This causes the voltage of 0V of the source line to be transmitted to the source region of the MOS transistor of the selected memory cell. Further, the voltage of −5V applied on the bit line is transmitted to such an electrode of the MOS capacitor of the selected memory cell as to be on the side of the substrate. With this, capacitive coupling due to the MOS capacitor causes a gate potential of the cell transistor to be lowered, to turn on the cell transistor. This in turn causes a hole current to flow between the source and the drain of the MOS transistor so as to generate hot electrons, which are injected into the gate electrode at an edge of the MOS transistor on the side of the source region, thus implementing programming.

By a second method, the N type well and the source line are supplied with a positive polarity high-level voltage, the word line is supplied with such a voltage as to turn on the selected transistor constituted the P-channel MOS transistor, for example, 0V, and the selected bit line is supplied with 0V.

This causes the positive polarity high-level voltage applied on the source line to be transmitted to the source region of the MOS transistor of the selected memory cell. Further, the voltage of 0V applied on the bit line is transmitted to the electrode of the MOS capacitor of the selected memory cell on the side of the substrate. With this, capacitive coupling due to the MOS capacitor causes the gate potential of the cell transistor to be lowered, to turn on the cell transistor. This causes a hole current to flow between the source and the drain of the MOS transistor so as to generate hot electrons, which are injected into the gate electrode at the edge of the MOS transistor on the side of the source region, thus implementing programming.

When reading the data, the N type well is supplied with a voltage of positive polarity, the selected bit line and the selected word line are supplied with 0V, and the non-selected bit lines, the non-selected word lines, and the source lines are supplied with the same voltage of positive polarity as the voltage applied on the N type well.

If the selected memory cell is in a written state, the cell transistor is turned on because the threshold voltage of the MOS transistor of the cell transistor is a positive polarity value, to flow a current through the bit line.

If the selected memory cell is not in the written state, on the other hand, the cell transistor is turned off because the threshold voltage of the MOS transistor of the cell transistor is a negative polarity value, to flow no current through the bit line. Whether the current flows through the bit line or not is decided by a sense-amplifier, to detect whether the data is "0" or "1".

Table 3 below summarizes the various voltages employed in programming and reading in a case where the P-channel transistor is used as the selected transistor and the cell transistor.

TABLE 3

|  | N type well | Source line | Word line | Bit line |
| --- | --- | --- | --- | --- |
| Programming method 1 | 0 V | 0 V | 0 V | −5 V |
| Programming method 2 | High-level voltage | High-level voltage | 0 V | 0 V |
| Reading | Positive voltage | Positive voltage | 0 V | 0 V |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
a logic circuit having MOS transistors; and
a non-volatile semiconductor memory device connected to the logic circuit,
wherein the non-volatile semiconductor memory device includes:
a selection transistor comprising a first MOS transistor having a gate electrode;
a source line connected to one end of the selection transistor;
a word line connected to the gate electrode of the selection transistor;

a cell transistor having a floating gate electrode, one end of the cell transistor being connected to the other end of the selection transistor, the cell transistor comprising a second MOS transistor; and a bit line connected to the other end of the cell transistor, and wherein each of a gate electrode of the MOS transistors, the gate electrode of the first MOS transistor and the floating gate electrode of the cell transistor are made of the same conductive material, and each of the gate electrode of the MOS transistors, the gate electrode of the first MOS transistor and the floating gate electrode of the cell transistor have the same thickness.

2. The semiconductor device according to claim 1, wherein the first MOS transistor and the cell transistor are formed in a substrate region.

3. The semiconductor device according to claim 1, further comprising:

an MOS capacitor connected between the other end of the selection transistor and the bit line.

4. A semiconductor device comprising:

a logic circuit having MOS transistors; and a non-volatile semiconductor memory device connected to the logic circuit, wherein the non-volatile semiconductor memory device includes:

a selection transistor comprising a first MOS transistor having a gate electrode;

a bit line connected to one end of the selection transistor;

a word line connected to the gate electrode of selection transistor;

a cell transistor having a floating gate electrode, one end of the cell transistor being connected to the other end of the selection transistor, the cell transistor comprising a second MOS transistor; and a source line connected to the other end of the cell transistor, and wherein each of a gate electrode of the MOS transistors, the gate electrode of the first MOS transistor and the floating gate electrode of the cell transistor are made of the same conductive material, and each of the gate electrode of the MOS transistors, the gate electrode of the first MOS transistor and the floating gate electrode of the cell transistor have the same thickness.

5. The semiconductor device according to claim 4, wherein the MOS transistors and the cell transistor are formed in a substrate region.

6. The semiconductor device according to claim 4, further comprising:

an MOS capacitor connected between the other end of the selection transistor and the source line.

* * * * *